United States Patent
Barge et al.

(10) Patent No.: US 7,235,427 B2
(45) Date of Patent: Jun. 26, 2007

(54) METHOD FOR TREATING SUBSTRATES FOR MICROELECTRONICS AND SUBSTRATES OBTAINED BY SAID METHOD

(75) Inventors: Thierry Barge, Grenoble (FR); Bruno Ghyselen, Seyssinet (FR); Toshiaki Iwamatsu, Osaka (JP); Hideki Naruoka, Hyougo (JP); Junichiro Furihata, Annaka (JP); Kiyoshi Mitani, Takasaki (JP)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 0 days.

(21) Appl. No.: 11/063,867

(22) Filed: Feb. 24, 2005

(65) Prior Publication Data
US 2005/0208322 A1 Sep. 22, 2005

Related U.S. Application Data

(60) Division of application No. 10/318,304, filed on Dec. 13, 2002, now Pat. No. 6,902,988, which is a continuation of application No. 10/069,163, filed as application No. PCT/FR00/02331 on Aug. 17, 2000, now abandoned.

(30) Foreign Application Priority Data
Aug. 20, 1999 (FR) ................. 99 10668

(51) Int. Cl.
*H01L 21/48* (2006.01)

(52) U.S. Cl. .......... 438/115; 438/457; 438/458; 438/459; 438/474; 438/475; 438/476; 438/477; 438/796; 438/797; 438/798; 438/799; 257/E21.122; 148/33.4

(58) Field of Classification Search ................ 438/115, 438/455–459, 474, 476, 477, 798–799; 257/E21.122; 148/33.4
See application file for complete search history.

(56) References Cited

U.S. PATENT DOCUMENTS 4,732,648 A 3/1988 Fronius et al.

(Continued)

FOREIGN PATENT DOCUMENTS

EP 0 460 437 B1 12/1991

(Continued)

OTHER PUBLICATIONS

Aspar et al., "Characterization of SOI Substrates: Application to Recent SIMOX and Unibond® Wafers," Electrochemical Society Proceedings, vol. 96-3, pp. 99-111 (1996).

*Primary Examiner*—Matthew Smith
*Assistant Examiner*—Thanh V. Pham
(74) *Attorney, Agent, or Firm*—Winston & Strawn LLP

(57) ABSTRACT

An embodiment of a multilayer wafer according to the invention includes a base substrate, a first layer associated with the base substrate, and a second layer on the first layer on side opposite from the base substrate in an axial direction and having a lateral edge. The first layer includes a ridge that protrudes axially and is disposed laterally adjacent the second layer measured in a direction normal to the axial direction for protecting the lateral edge. This ridge can surround portion the lateral edge in an axial cross-section for preventing edge falls. Also, the ridge can have an axial height greater than the axial thickness of the second layer. In one embodiment, the second layer includes an oxydizable semiconductor and the first layer includes an oxidized insulator.

15 Claims, 6 Drawing Sheets

U.S. PATENT DOCUMENTS

| | | |
|---|---|---|
| 5,374,564 A | 12/1994 | Bruel |
| 5,589,422 A | 12/1996 | Bhat |
| 5,696,020 A | 12/1997 | Ryum et al. |
| 5,905,286 A | 5/1999 | Iwamatsu et al. |
| 5,910,672 A * | 6/1999 | Iwamatsu et al. ............ 257/347 |
| 6,140,210 A | 10/2000 | Aga et al. |
| 6,221,774 B1 | 4/2001 | Malik |
| 6,232,201 B1 * | 5/2001 | Yoshida et al. .............. 438/423 |
| 6,238,990 B1 | 5/2001 | Aga et al. |
| 6,284,629 B1 | 9/2001 | Yokokawa et al. |
| 6,403,450 B1 | 6/2002 | Maleville et al. |
| 6,613,678 B1 | 9/2003 | Sakaguchi et al. |

FOREIGN PATENT DOCUMENTS

| | | |
|---|---|---|
| EP | 0 933 810 A1 | 8/1999 |
| JP | 59-011631 | 1/1984 |
| JP | 62-078829 | 4/1987 |
| JP | 08-250469 | 9/1996 |
| JP | 10-275905 | 10/1998 |
| JP | 2002-022159 | 1/2000 |

* cited by examiner

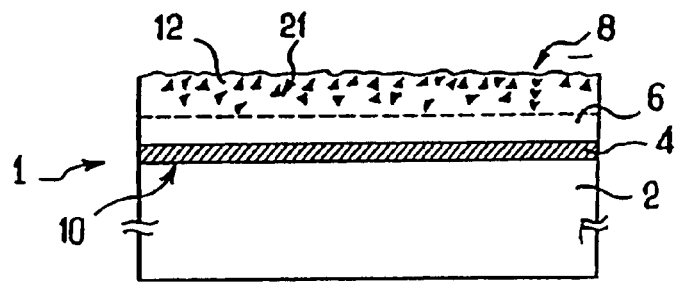
FIG. 1A
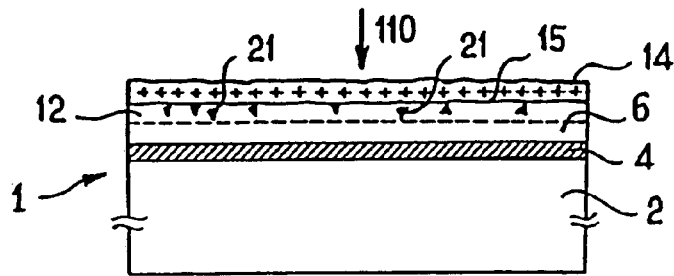
FIG. 1B
FIG. 1
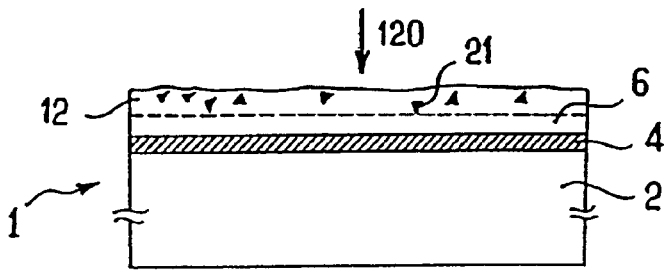
FIG. 1C
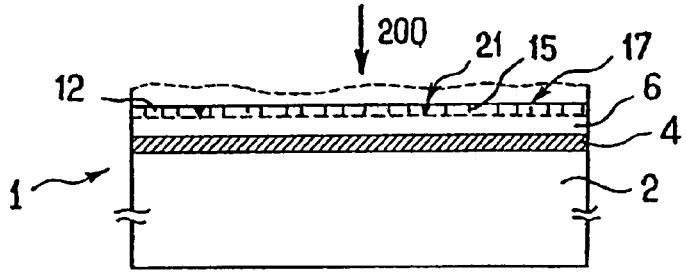
FIG. 1D
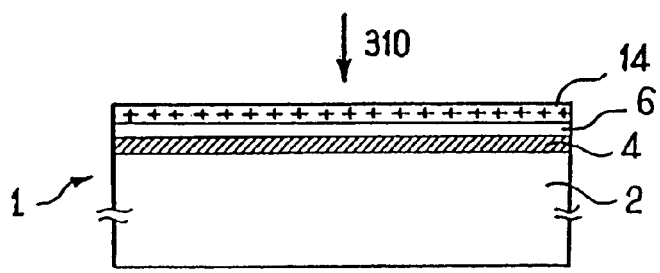
FIG. 1E
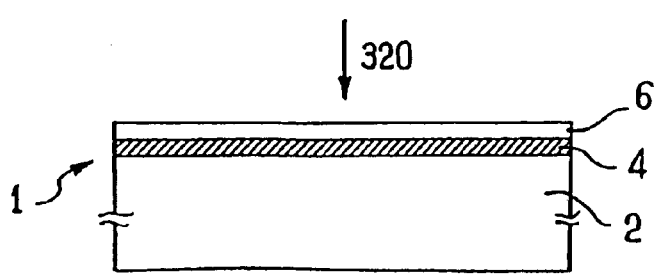
FIG. 1F

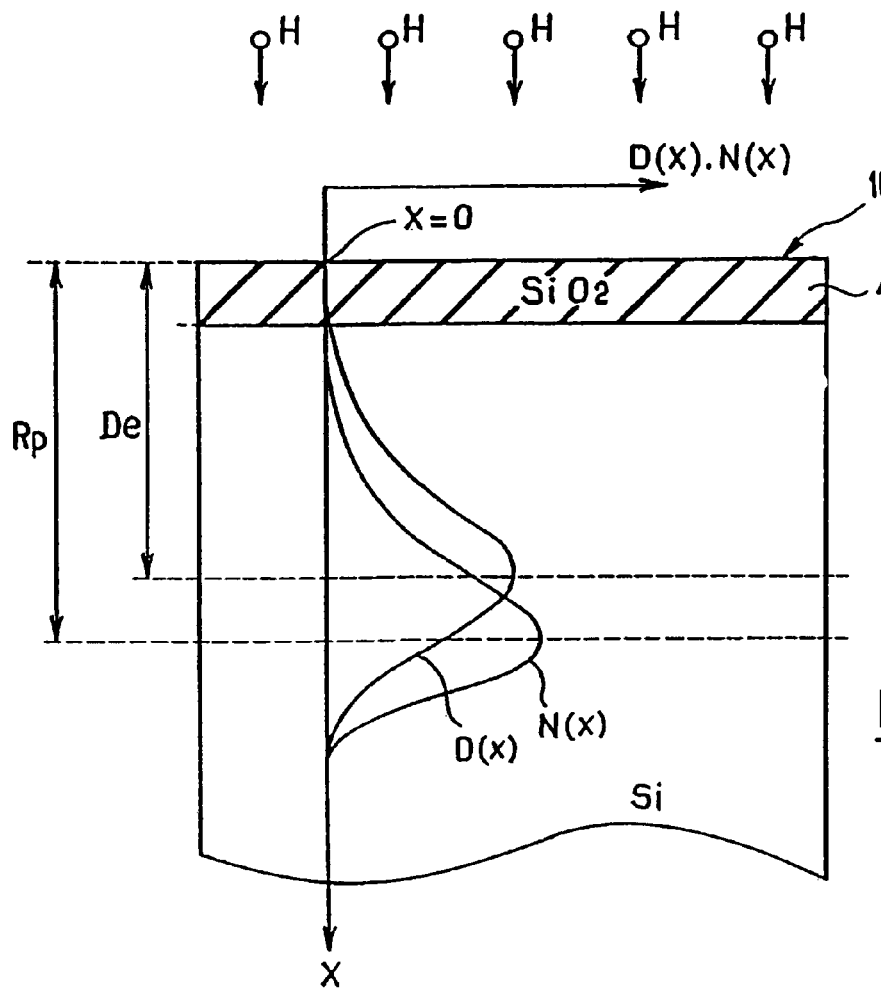
FIG_2
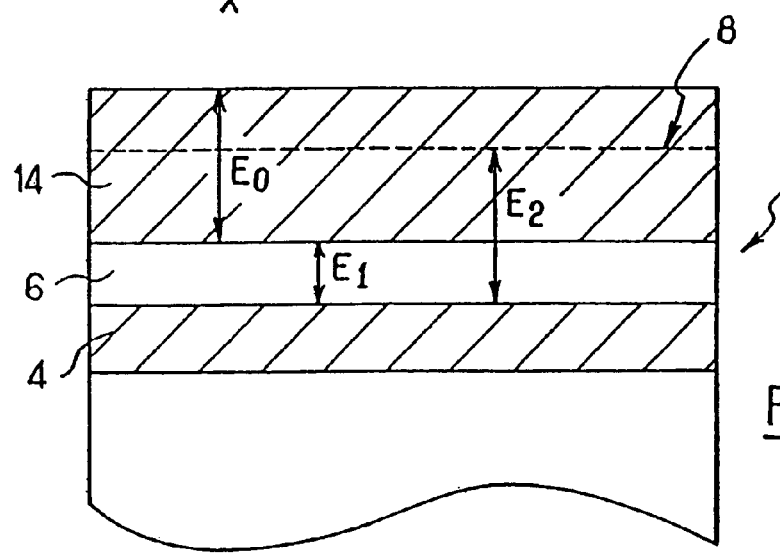
FIG_4

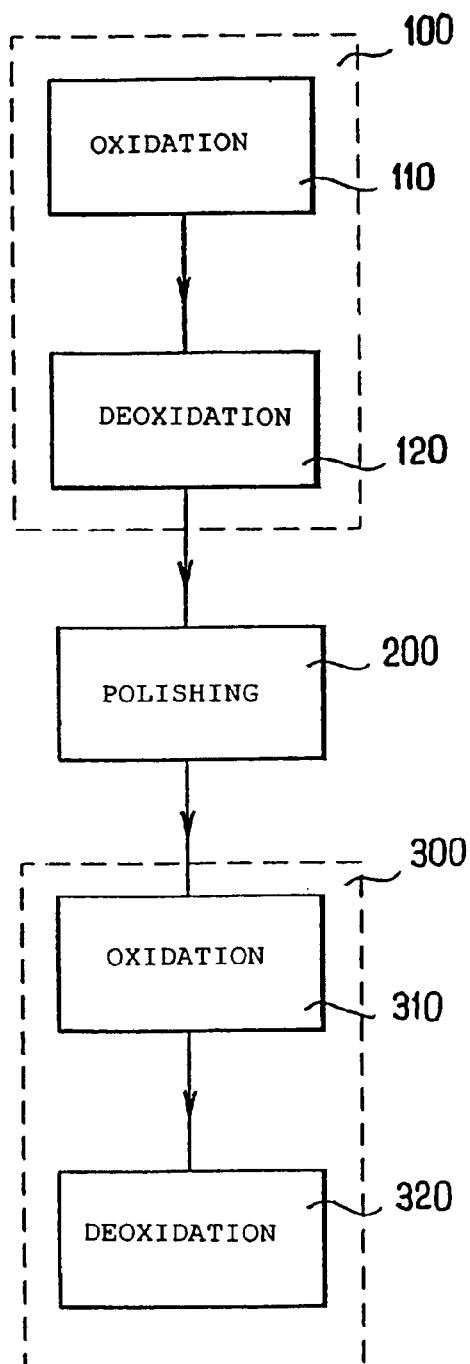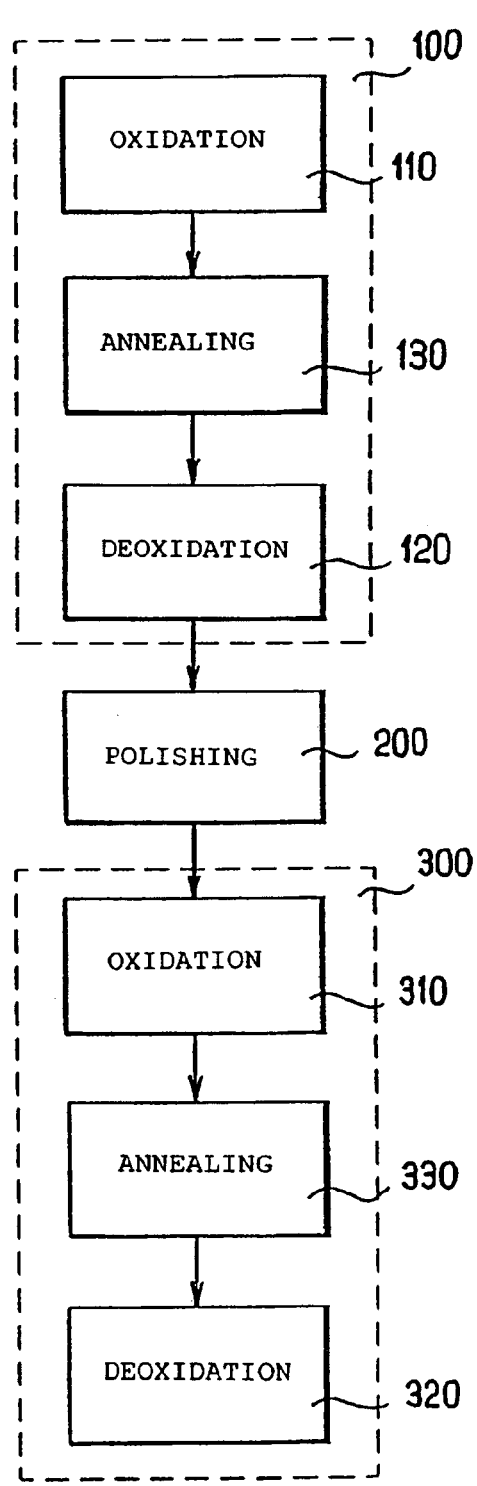

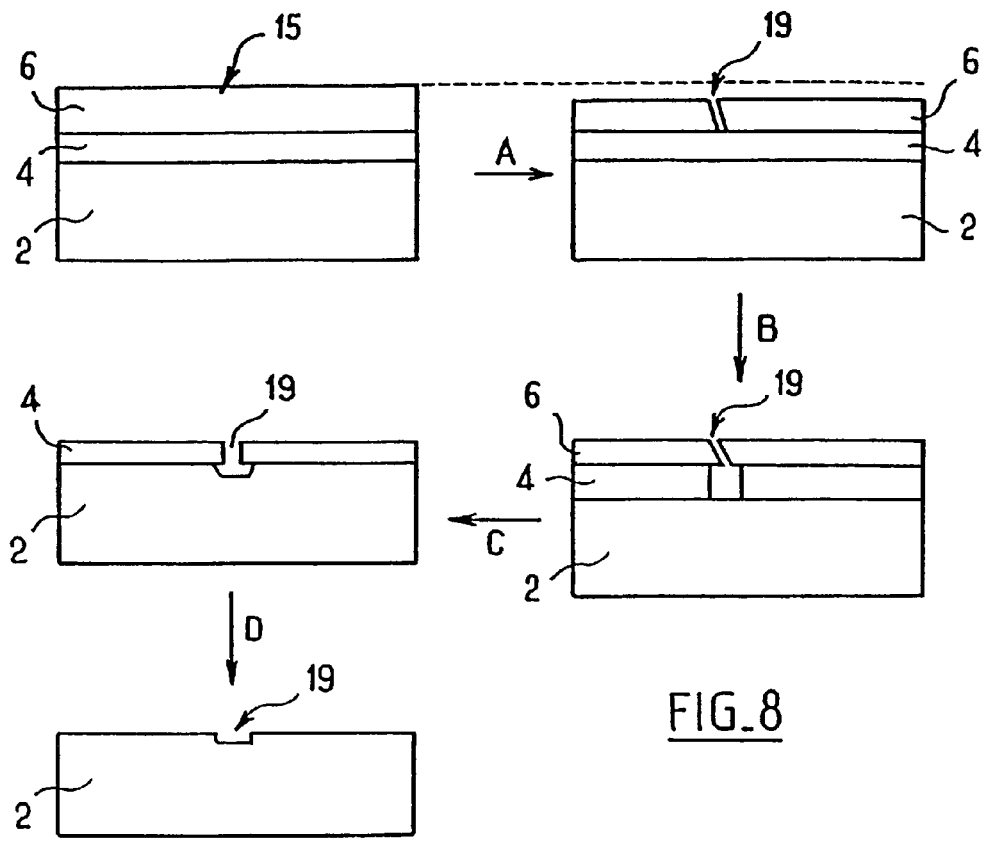
FIG_8
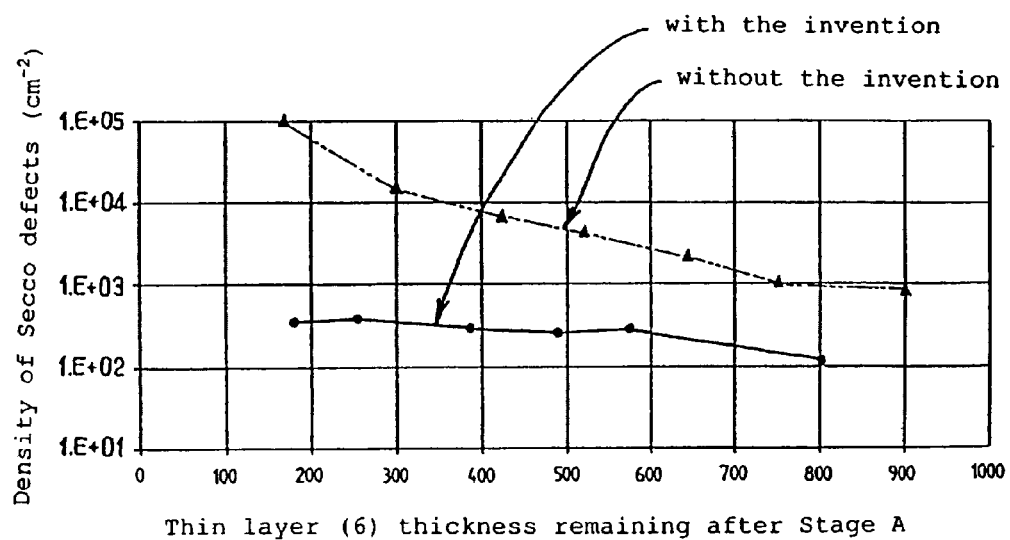
FIG_9

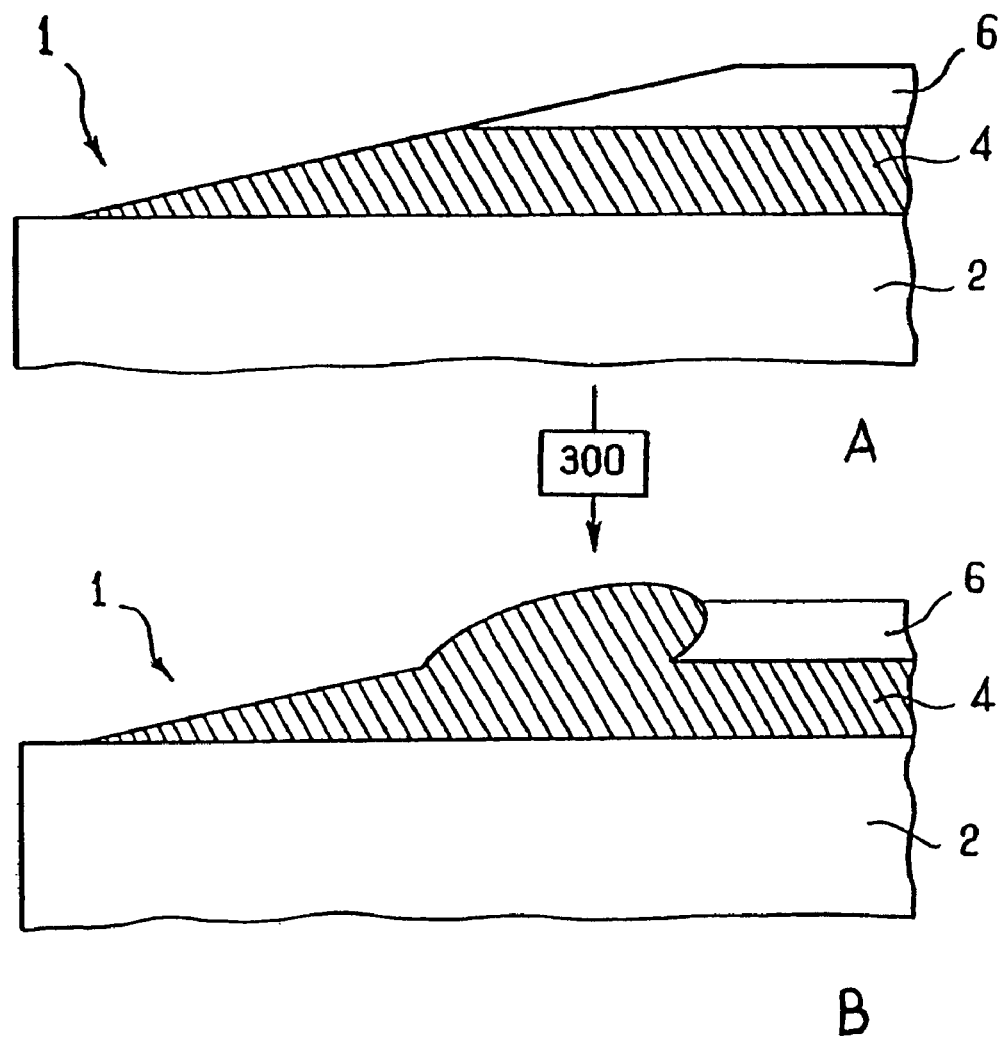
FIG_10

METHOD FOR TREATING SUBSTRATES FOR MICROELECTRONICS AND SUBSTRATES OBTAINED BY SAID METHOD

CROSS REFERENCE TO RELATED APPLICATIONS

This application is a division of U.S. application Ser. No. 10/318,304 filed Dec. 13, 2002 now U.S. Pat. No. 6,902,988, which is a continuation of U.S. application Ser. No. 10/069,163, filed Feb. 20, 2002 now abandoned, which is the U.S. national phase application of PCT/FR00/02331 filed Aug. 17, 2000, the content of each of which is hereby expressly incorporated herein by reference thereto.

FIELD OF THE INVENTION

The invention relates to the field of processes for the treatment of substrates intended for the manufacture of components for microelectronics and/or for optoelectronics. The invention also relates to the substrates obtained by this process. More specifically, the invention relates to the field of processes for treating substrates which are wholly semiconducting (for example of silicon) or wholly insulating (for example of quartz) or else composed of a stack of semiconducting or insulating layers. They can be substrates on which a layer is deposited (for example an epitaxial layer) or substrates comprising nonhomogeneous structures, such as substrates comprising components or component parts at more or less advanced stages in their preparation.

BACKGROUND OF THE INVENTION

There exists, over a certain depth from the surface of at least one face of substrates that are for the manufacture of components for microelectronics and/or optoelectronics, a layer of material which, at least partially, is a constituent of the components produced on this face. This layer will subsequently be denoted by the expression "working layer".

The quality of this working layer and in particular that of its surface, for example in terms of roughness, conditions that of the components.

Continual research is being carried out to improve the quality of this working layer. U.S. Pat. No. 6,221,774, for example, provides a polishing process by which the surface of the working layer is polished with a roller, the rotational axis of which is parallel to this surface. However, polishing results in defects, such as work hardening defects, in the layer of material underlying the polished surface.

SUMMARY OF THE INVENTION

The present invention relates to a method for improving the quality of a layer of a multilayer wafer, which may be a semiconductor or optoelectronic wafer and preferably can be used for producing circuitry thereon. A preferred embodiment of the method includes providing a wafer having an exposed layer with structural defects therein. The composition of a first outer layer of the exposed layer that contains at least some of the defects is altered, and the altered first outer layer is removed from the wafer to expose a second outer layer of the exposed layer that has an exposed surface. The surface of the second outer layer is smoothed. The composition of the smoothed second outer layer is also altered, and the altered second out layer is removed to increase the quality of the exposed layer.

The defects can comprise impurities, and the wafer can be provided by splitting the wafer from another wafer, such as to expose the exposed layer. Atomic species can be implanted between the provided wafer and the another wafer, such as to facilitate the splitting, and the defects can comprise some of the atomic species.

Preferably, the composition of the first outer layer is altered by oxidation, and the first outer layer is removed by deoxidation. The composition of the second outer layer can also be altered by oxidation, and the second outer layer can be removed by deoxidation. In an embodiment of the invention, the second outer layer that is removed has a thickness greater than 100 Å.

The preferred smoothing of the surface of the second outer layer accomplished by polishing. This can produce additional defects, and the altering and removal of the second outer layer removes a substantial portion of the additional defects.

The exposed layer can be annealed at least between the altering and removing of at least one of the first and second outer layers to repair defects therein. Most preferably, the exposed layer is annealed between the altering and removing of each of the first and second outer layers, and the annealed outer layer is at least partially oxidized for its protection thereof prior to completing the annealing. The annealing can also be conducted to provide another layer adjacent the exposed layer in an axial direction with a ridge that protrudes axially to a position disposed in a lateral direction from the exposed layer for protecting an edge of the exposed layer.

A preferred method includes providing the wafer having an oxydizable exposed layer with structural defects therein, and oxidizing a first outer layer of the exposed layer that contains at least some of the defects. The oxidized first outer layer is deoxidized to remove the first outer layer from the wafer to expose a second outer layer of the exposed layer that has an exposed surface. The surface of the second outer layer is smoothed and then oxidized. The oxidized second out layer is deoxidized to remove it from the exposed layer to increase the quality of the exposed layer.

Preferably, the wafer is a semiconductor wafer. The wafer can comprise an insulator layer adjacent the exposed layer, and the second outer layer can comprise silicon having a surface defect density greater than 500 $cm^{-2}$.

An embodiment of a multilayer wafer according to the invention includes a base substrate, a first layer associated with the base substrate, and a second layer on the first layer on side opposite from the base substrate in an axial direction and having a lateral edge. The first layer includes a ridge that protrudes axially and is disposed laterally adjacent the second layer measured in a direction normal to the axial direction for protecting the lateral edge. This ridge can surround portion the lateral edge in an axial cross-section for preventing edge falls. Also, the ridge can have an axial height greater than the axial thickness of the second layer. In one embodiment, the second layer includes an oxydizable semiconductor and the first layer comprises an oxidized insulator.

BRIEF DESCRIPTION OF THE DRAWINGS

Other aspects, aims and advantages of the invention will become apparent on reading the detailed description which follows. The invention will also be better understood with reference to this description, considered in conjunction with the appended drawings, in which:

FIGS. 1A to 1F represent the change in a substrate (seen in cross-section) during its treatment by a first embodiment of the process according to the invention;

FIG. 2 is a diagram representing the densities of implanted atoms and of defects generated by the implantation in a substrate prepared by one of the alternative forms of the SmartCut® process, as a function of the distance with respect to the surface bombarded during the implantation;

FIG. 3 is a flowchart showing the process illustrated by FIG. 1;

FIG. 4 is a diagrammatic representation in cross-section of a substrate 1 which has been subjected to an oxidation stage in the context of the process illustrated by FIG. 3;

FIG. 6 is a flowchart of a second embodiment of the process according to the invention;

FIG. 8 diagrammatically represents the change in a substrate, seen in cross-section, during its treatment by a technique known as the Secco technique;

FIG. 9 is a graph showing the surface density of defects revealed by the technique illustrated in FIG. 8, as a function of the thickness of the layer remaining after the first stage of this technique; and FIG. 10 is a diagrammatic representation of the change in the edge of a substrate during the second sacrificial oxidation stage of the process described by FIG. 6.

DETAILED DESCRIPTION OF THE PREFERRED EMBODIMENTS

Figure 5:
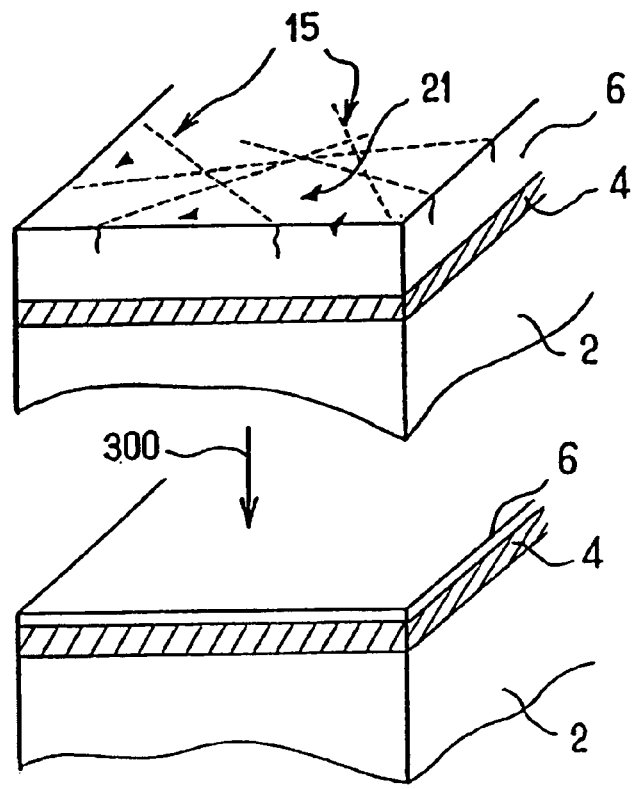
FIG. 5 is a diagrammatic representation of the change in a substrate (seen in perspective) during the second sacrificial oxidation stage of the process illustrated by FIG. 3.

The invention improves the quality of this working layer both in terms of roughness and in terms of concentration of defects. This is achieved according to the invention by virtue of a process for the treatment of substrates for microelectronics or optoelectronics comprising a working layer at least partially composed of an oxidizable material on at least one of their faces, this process comprising:
- a first sacrificial oxidation stage for removing material constituting the working layer over a certain surface thickness of each substrate,
- a stage of polishing the face which has been subjected to the first sacrificial oxidation stage, and
- a second sacrificial oxidation stage for again removing material constituting the working layer on the polished face.

When a layer of material comprising defects exists over a certain thickness from the surface of a substrate with an unsatisfactory roughness, the first sacrificial oxidation stage makes it possible to remove said thickness of this defect-comprising layer.

However, this first sacrificial oxidation stage, which does not necessarily result in the complete removal of the defect-comprising layer, generally does not make it possible either to sufficiently reduce the roughness of the surface which has been subjected to it. The first sacrificial oxidation stage is then usefully complemented by a polishing stage which makes it possible to obtain the desired roughness.

The second sacrificial oxidation stage subsequently makes it possible, in a way analogous to the first, to remove in particular the layer into which the polishing stage has introduced defects and/or the remainder of the defect-comprising layer. However, starting this time from a polished surface, the roughness of the face of the substrate, after the second sacrificial oxidation stage, is satisfactory and compatible with the use of the working layer in micro- or optoelectronic applications.

The layer in which the majority of the defects generated by the polishing are found generally has a thickness of greater than 100 Å. Consequently, a layer of material will advantageously be removed, by virtue of the second sacrificial oxidation stage, over a thickness of between 400 Å and 1000 Å.

It is thus understood that the invention consists of a combination of sacrificial oxidation and polishing stages. Each of these stages participates in the removal of the part of the working layer comprising an excessively high concentration of defects, the second sacrificial oxidation stage optionally participating more specifically in the repairing of the defects generated by the polishing stage.

This process is more advantageous than a polishing alone. Thus, as indicated above, the second sacrificial oxidation stage makes it possible to remove the region into which the polishing has introduced defects. However, furthermore, it makes it possible to limit other harmful effects of the polishing. This is because, if there is a relatively thick layer of defects at the start, a lengthy polishing is necessary in order to remove it. In point of fact, a lengthy polishing generally results in a lack of uniformity of thickness. This disadvantage becomes increasingly critical as the thickness of material to be removed increases and thus as the polishing stage becomes longer. This is in particular the case when the thickness to be removed reaches 150 to 200 nm. In addition, lengthy polishings slow down the execution of the process and result in a fall in productivity. The first sacrificial oxidation stage makes it possible to avoid these disadvantages by limiting the polishing essentially to that which is necessary to reduce the roughness, since this first sacrificial oxidation stage has contributed not insignificantly to removing the part of the working layer comprising a high concentration of defects. Furthermore, by reducing the polishing needed, the defects generated by the latter may be developed on a lesser scale.

The process in accordance with the present invention thus makes it possible, by a specific combination of stages consisting in removing material by sacrificial oxidation and by polishing, to obtain a working layer of improved quality, that is to say with a reduced concentration of defects and, in addition, with an optimized surface roughness. This is achieved while retaining a uniform substrate thickness and an optimum efficiency.

The process according to the invention is advantageously employed to improve the quality of a working layer made of oxidizable material, such as silicon.

In this case, the first sacrificial oxidation stage comprises a stage of oxidation of the oxidizable material over at least a portion of the thickness of this defect-comprising material and a stage of deoxidation of the material thus oxidized.

The second sacrificial oxidation stage advantageously comprises a stage of oxidation of the oxidizable material over a certain thickness of material into which the polishing stage has introduced defects and a stage of deoxidation of the material thus oxidized. Consequently, a process according to the invention advantageously comprises, in addition, before and/or after the polishing stage, a stage of annealing the substrate.

If a stage of annealing the substrate is carried out before the polishing stage, the oxidation stage of the first sacrificial oxidation stage is advantageously capable of forming, before the end of this annealing stage, an oxide layer which protects the remainder of the substrate during at least a portion of the annealing. In this case, the oxide layer protects the remainder of the substrate from certain harmful effects of the annealing, such as the pitting phenomenon observed at the surface of certain semiconductors when the latter are annealed under a nonoxidizing atmosphere (nitrogen, argon, vacuum, and the like). This pitting phenomenon takes place in the case of silicon in particular when the latter is bare, that is to say when it is not covered with oxide at all. Conversely, however, the annealing makes it possible to repair defects brought about by the oxidation.

If a stage of annealing the substrate is carried out after the polishing stage, the oxidation of the second sacrificial oxidation stage is advantageously capable of forming before the end of this annealing stage an oxide layer which protects the remainder of the substrate in the same way as was described for the first sacrificial oxidation.

The process according to the invention is also advantageously employed to improve the quality of a working layer made of material which is not easily oxidizable. The term "oxidizable" is used herein without distinction whether the so-called oxidizable material is easily oxidizable or not easily oxidizable.

The present invention is described in a detailed way below in the specific but non-limiting context of a process for the manufacture of substrates known as the SmartCut® process. A specific way of carrying out the SmartCut® process is disclosed, for example, in U.S. Pat. No. 5,374, 564. It is a process for the manufacture of substrates comprising a layer or a thin film of semiconductor on one of their faces. According to one of its alternative forms, the SmartCut® process comprises:

- a stage of implanting atoms in an implantation region under a face of a semiconductor wafer;
- a stage of bringing the face of the wafer which has been subjected to the implantation into intimate contact with a backing substrate; and
- a stage of cleaving the wafer at the level of the implantation region in order to transfer, onto said backing substrate, the portion of the wafer situated between the surface which has been subjected to the implantation and the implantation region and in order to form a thin film or a layer of semiconductor on said backing substrate.

The term "implanting atoms" is understood to mean any bombardment of atomic species, including ionic species, capable of introducing these species into material with a concentration maximum for these species in this material, this maximum being situated at a predetermined depth with respect to the bombarded surface. The atomic or ionic species is introduced into the material with an energy which is also distributed about a maximum. The implantation of the atomic species in the material can be carried out by virtue of an ion beam implanter, an implanter by immersion in a plasma, and the like. The term "cleaving" is understood to mean any fracture of the implanted material at the level of the concentration maximum, in this material, of the implanted species or in the vicinity of this maximum. This fracture does not necessarily occur along a crystallographic plane of the implanted material.

In a specific application of this process, a layer of silicon on insulator, also known as SOI, is prepared. Several ways can be envisaged for preparing a layer of silicon on insulator according to the SmartCut® process. According to a first way, it is possible, for example, to cover a silicon wafer on its implantation face with a layer of insulating oxide and to use a backing substrate, for example also made of silicon, for the transfer.

According to a second way, it is possible to have a completely semiconducting layer which is transferred either onto a backing substrate covered with an insulating layer or onto a completely insulating backing substrate (ex.: quartz).

According to a third way, it is possible to have an insulator on the semiconductor wafer and to transfer a layer of this wafer either onto a backing substrate itself also covered with insulator or onto a completely insulating substrate.

After cleavage and transfer, an SOI structure with a layer transferred onto a face of the backing substrate is obtained in all cases, the free surface of this layer corresponding to a cleavage surface. It is then advantageous to use the process in accordance with the present invention to reduce the roughness of this cleavage surface and the density of defects in the transferred layer.

These defects can be revealed by various techniques (known as the "Wright", "Secco" and "Schimmel" techniques and the like, from the names of their inventors). Only the defects revealed by the Secco technique will be considered subsequently.

Several embodiments of the process according to the invention will be described below in the specific but non-limiting context of the SmartCut® process applied to the preparation of an SOI structure.

Such an SOI structure is represented diagrammatically in FIG. 1A. It consists of a substrate 1 which comprises a backing 2 made of silicon, an insulating layer 4 made of silicon oxide and a thin layer 6 of silicon on the backing 2.

The insulating layer 4 is sandwiched between the backing 2 and the thin layer 6. This insulating layer 4 can originate from the oxidation of the backing 2 and/or of the thin layer 6. After cleavage and transfer of the thin layer 6 onto the backing 2, the free surface of this thin layer 6 corresponds to a cleavage surface 8 which exhibits a roughness which it is desired to reduce. Furthermore, over a certain thickness, the thin layer 6 exhibits, from this cleavage surface 8, a region of defects 12. These defects are defects created during the stage of implanting atoms and by the cleaving (tearing off of material, for example). These defects are represented in FIG. 1 in the form of triangles. They will be referred to below as implantation and cleavage defects 21. The generation of implantation and cleavage defects 21 is illustrated diagrammatically by the diagram in FIG. 2. The atoms, for example hydrogen atoms, implanted with a certain energy are distributed in the implanted material in the vicinity of a surface situated at a certain depth Rp with respect to the implantation face 10. This surface corresponds to the maximum in the profile of the concentration $N(x)$ of atoms implanted in the material as a function of the distance x with respect to the implanted face 10. The distribution of the concentration $N(x)$ of implanted atoms about this maximum, situated at a distance Rp from the face 10, gradually decreases from this surface over a certain distance on either side of the surface. For example, for an implantation of hydrogen at 300 nm, this distance is approximately 80 nm on either side of Rp. However, as illustrated by FIG. 2, the maximum in the density of defects $D(x)$ as a function of the depth x from the implanted face 10 is situated at a distance De, with respect to this implanted face 10, which is less than the distance Rp.

It should be noted that it will possibly be necessary, in the context of the invention, to implant the atoms with a greater energy during the SmartCut® process than in the context of those occasions when it is employed in conjunction with the processes of the prior art, so as to be able to remove the amount of material exhibiting a high concentration D(x) of defects while retaining a final thin layer 6 having the desired thickness.

As the fracture occurs in the vicinity of the surface 5 situated at the distance Rp from the implanted face 10, the majority of the defects 15, 21 are found in the thin layer 6 transferred onto the backing 2. It must be understood that the "vicinity" does not necessarily indicate a region distributed approximately equivalently on either side of the depth situated at the distance Rp. The fracture can instead occur in the main in the part situated between the implanted face 10 and the surface situated at the depth Rp from this implanted face 10. However, it can also instead occur in the main in the part situated beyond the surface situated at the depth Rp from the implanted face 10, with respect to this implanted face 10. As illustrated by FIG. 1A, after cleavage and transfer, the implanted face 10 is found embedded and the cleavage surface 8 is free. The implantation and cleavage defects 21 are thus found in the region of defects 12 situated in the vicinity of this cleavage surface 8.

According to a first embodiment of the process in accordance with the present invention, this comprises the stages represented in the flow chart in FIG. 3. This process comprises a first sacrificial oxidation stage 100, followed by a polishing stage 200, itself followed by a second sacrificial oxidation stage 300. Each sacrificial oxidation stage 100, 300 is divided up into an oxidation stage 110, 310, followed by a deoxidation stage 120, 320.

Each oxidation stage 110, 310 is preferably carried out at a temperature of between 700° C. and 1100° C. The oxidation 110, 310 can be carried out by a dry route or by the wet oxidation process. In the dry process, the oxidation 110, 310 is carried out, for example, by heating the substrate under oxygen gas. In the wet process, the oxidation 310, 320 is carried out by heating the substrate 1 in an atmosphere charged with water vapor. By the dry or wet process, the oxidation atmosphere can also be charged with hydrochloric acid according to conventional methods known to a person skilled in the art.

The wet process is preferred as it introduces, into the crystalline structure, fewer defects such as stacking faults, "HF" defects (an "HF" defect is the name given to a defect whose presence is revealed by a decorative halo in the embedded oxide of the SOI structure after treatment of this structure in a bath of hydrofluoric acid), and the like.

Each deoxidation stage 120, 320 is preferably carried out in solution. This solution is, for example, a 10 or 20% hydrofluoric acid solution. To remove a thousand to several thousand angstroms of oxide, the substrate 1 is immersed in such a solution for several minutes.

The substrate 1 is then subjected to the polishing stage 200. This polishing 200 is carried out by the chemical-mechanical route according to techniques known to a person skilled in the art.

After the polishing 200, the substrate 1 is subjected to the second sacrificial oxidation 300. This is analogous to the first sacrificial oxidation 100. The polishing 200 contributes, with each sacrificial oxidation stage 100, 300, to removing material and in particular defect-comprising material.

The change in the substrate 1 during this process is represented diagrammatically in FIGS. 1A to 1F.

After the first oxidation stage 110, described above, an oxide layer 14 is formed in the vicinity of the cleavage surface 8 (FIG. 1B). This oxide layer 14 is represented diagrammatically in a more detailed way in FIG. 4. This oxide layer 14, with a thickness $E_0$, has a greater volume than that corresponding to the oxidized silicon. The "ghost" of the position of the cleavage surface 8 is represented in FIG. 4 by dotted lines. It should be pointed out that the sum of the thickness $E_1$ of the thin layer 6 of silicon remaining between the insulating layer 4 and the oxide layer 14 and of the thickness $E_0$ of said oxide layer 14 is greater than the thickness $E_2$ of the thin layer 6 of silicon before oxidation.

After the first oxidation stage 110, the substrate 1 is subjected to a deoxidation stage 120 targeted at removing the oxide layer 14.

On conclusion of the first sacrificial oxidation 100, the region of defects 12 is largely but generally not completely removed. Furthermore, the initial roughness of the cleavage surface 8, although reduced by this first sacrificial oxidation 100, still remains too high (FIG. 1C).

The substrate 1 is thus subjected to the polishing stage 200. As represented diagrammatically in FIG. 1D, the polishing 200 makes it possible to further reduce the roughness of the free surface of the thin layer 6. On conclusion of this polishing stage 200, the roughness is very low. Measured with an atomic force microscope, this roughness is of the order of 1 Å rms (rms is the acronym for the expression "root mean square").

However, a chemical-mechanical polishing produces work hardening defects 15 under the polished surface 17 over a certain depth of material.

The work hardening is dependent on changing parameters, such as the pressure of the polishing pad on the substrate 1, the wear of this pad, and the like. The work hardening defects 15 are visible at the surface by microscopy (atomic force microscopy, for example) in the form of scratches which are in fact composed of alignments of crystal defects which can be displayed by the method of displaying of Secco type. However, in addition to these work hardening defects 15 generated by the polishing, there still mainly remain implantation and cleavage defects 21. These combined defects are illustrated diagrammatically by FIG. 5. The work hardening defects 15 generated by the polishing are represented by dotted lines and the implantation and cleavage defects 21, remaining after the first sacrificial oxidation 100 and the polishing 200, are represented by triangles.

The substrate 1 is then subjected to a second sacrificial oxidation 300 targeted at removing the material comprising the defects 15 generated under the effect of the polishing 200 and the remaining implantation and cleavage defects 21 of the thin layer 6 after cleavage (FIGS. 1D and 1F). This second sacrificial oxidation 300 is analogous to the first. However, starting from a polished surface, the free surface of the thin layer 6, after the deoxidation stage 320 (FIG. 1F), exhibits a satisfactory roughness. On conclusion of this first embodiment of the process in accordance with the present invention, a substrate 1 is obtained with an SOI structure in which the concentration of defects in the thin layer 6 has been greatly reduced.

According to a second embodiment of the process according to the invention, illustrated by FIG. 6, each sacrificial oxidation comprises a stage of annealing (130, 330) of the substrate 1. As with the first embodiment of the process according to the invention, this second embodiment is described below in combination with the SmartCut® process applied to the manufacture of SOI structures.

The term "annealing" denotes any thermal operation intended to improve the qualities of the material of the working layer 6. This annealing 130, 330 can be a heat treatment carried out at a constant temperature or at a variable temperature. In the latter case, the annealing 130, 330 can be carried out, for example, with a gradual increase in the temperature between two values or with a cyclic oscillation between two temperatures, and the like.

The annealing 130, 330 is preferably carried out, at least in part, at a temperature of greater than 1000° C. and more particularly at approximately 1100-1200° C. The annealing 130, 330 is preferably carried out under a nonoxidizing atmosphere. This atmosphere can comprise argon, nitrogen, hydrogen and the like or a mixture of these gases. The annealing 130, 330 can also be carried out under vacuum. Consequently, in order to protect the remainder of the thin layer 6 during the annealing 130, 330 and to avoid the pitting phenomenon described above, the oxidation stage 110, 310 of each sacrificial oxidation 100, 300 is preferably carried out before the annealing stage 130, 330. According to an advantageous alternative form of the process according to the invention, the oxidation begins with the beginning of the rise in temperature of the annealing 130, 330 and terminates before the end of the latter.

The stage of annealing 130, 330 the substrate 1 makes it possible to repair the defects generated in the thin layer 6 during the preceding stages of the process for the manufacture and preparation of this substrate 1. More particularly, the annealing stage 130, 330 can be carried out for a time and at a temperature such that crystal defects, such as stacking faults, HF defects, and the like, generated in the thin layer 6 during the stage of formation of each oxide layer 14 are repaired by this annealing.

This annealing stage 130, 330 additionally exhibits the advantage of strengthening the bonding interface between the thin layer 6 transferred during the SmartCut® process and its backing 2.

The density of defects remaining in the thin layer 6 is here again greatly decreased after the treatment of the substrate 1 by the alternative form of the process according to the invention illustrated by FIG. 6.

Figure 7:
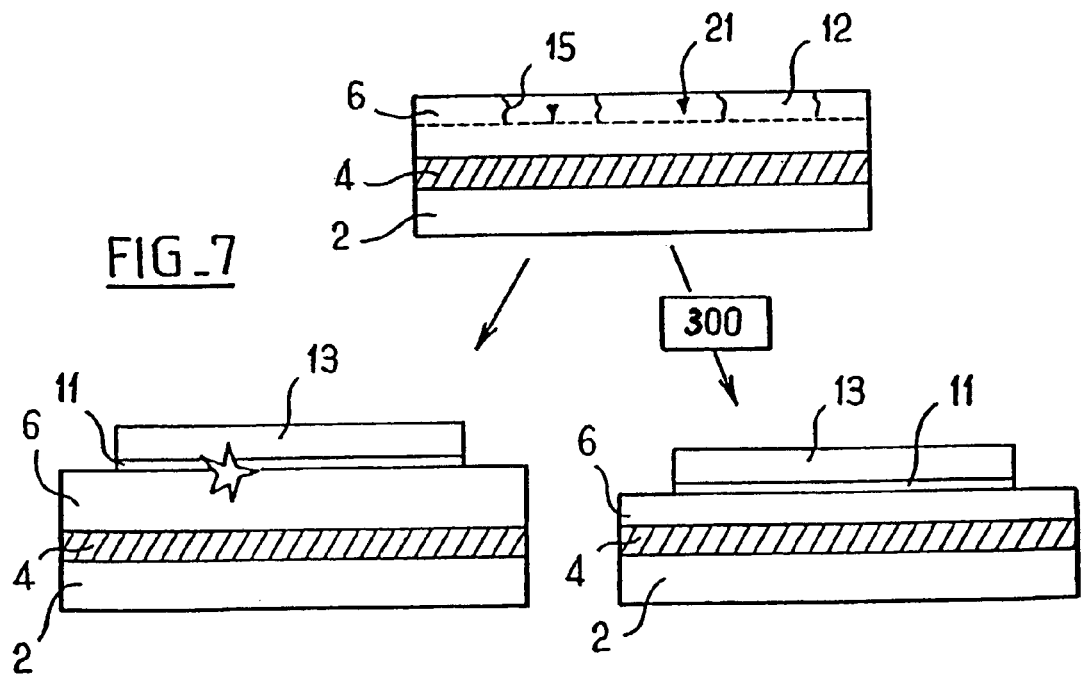
FIG. 7 is a diagrammatic representation of the production of a capacitive structure on substrates (seen in cross-section), one of which has not and one of which has been subjected to the second sacrificial oxidation stage in accordance with the process illustrated in FIG. 6.

Electrical measurements were carried out in order to compare in particular the improvement in the electrical properties contributed by the second sacrificial oxidation 300. To this end and as represented diagrammatically in FIG. 7, capacitive structures were produced on the free surface of the thin layer 6 of substrates 1. The structure shown on the left has not been subjected to the second sacrificial oxidation 300, while the structure shown on the right has been subjected to the second sacrificial oxidation 300.

In both cases, the capacitive structure simulates a gate oxide. It is composed of a layer of insulating oxide 11 formed on the free surface of the thin layer 6 and of an electrode 13 positioned on this layer of insulating oxide 11.

The breakdown voltage measured on these capacitive structures is then compared with that measured on capacitive structures produced on a "defect-free" material, that is to say a material which has not been subjected either to implantation or to cleavage. It is then found that the capacitive structures produced on the SOI structures which have not been subjected to a second sacrificial oxidation 300 or which have been subjected to a second sacrificial oxidation 300 which forms and removes 50 nm of oxide exhibit a higher frequency of failure (breakdown) than capacitive structures produced on a "defect-free" material; whereas the capacitive structures produced on the SOI structures which have been subjected to a second sacrificial oxidation 300 which forms and removes 200 nm of oxide exhibit a frequency of failure (breakdown) which is comparable with that of the capacitive structures produced on a "defect-free" material. The notion of frequency of failure covers the fact that there is observed, unpredictably, during the tests on the capacitive structures described above, a breakdown, under the same conditions as the conventional conditions of use, with a certain frequency. In other words, there are virtually no more failing capacitive structures produced on a material which has been subjected to a second sacrificial oxidation 300 which forms and removes 200 nm of oxide than failing capacitive structures produced on a "defect-free" material.

This shows that the thin layer 6 after having been subjected to the process according to the invention, with a second sacrificial oxidation 300 comprising an annealing 330 which removes a sufficient thickness of material, exhibits virtually no more defects.

The concentration of defects can be determined by displaying them by virtue of a solution of Secco type, the composition of which is known to a person skilled in the art. Thus, starting from an SOI substrate 1 composed of 2000 Å of silicon on 4000 Å of silicon oxide, a standard technique for displaying defects by virtue of a solution of Secco type is illustrated in FIG. 8. It comprises:

a Stage A which consists in immersing the substrate 1 for 12 to 23 seconds in a solution of Secco type in order to etch 1100 to 1900 Å of silicon from the thin layer 6 and more rapidly to selectively etch this thin layer 6 at the crystal defects in the material (comprising, inter alia, those generated by the polishing 200), until holes 19 corresponding to the sites of these defects open onto the insulating layer 4;

a Stage B which consists in immersing the substrate 1 in a hydrofluoric acid solution in order to etch, by widening them in the insulating layer 4, the holes 19 produced in the preceding stage;

a Stage C which consists in again immersing the substrate 1 in a solution of Secco type in order to remove the remainder of the thin layer 6 and to propagate the holes 19 in the backing 2; and a Stage D which consists in again immersing the substrate 1 in a hydrofluoric acid solution in order to completely remove the insulating layer 4.

The holes 19 remaining in the backing 2 are sufficiently large to be able to be counted under a microscope.

It should be noted that the thin layer 6 thickness remaining after Stage A should be particularly well controlled as the determination of the density of defects by the technique described above is very sensitive thereto.

FIG. 9 represents counts of holes 19 thus displayed as a function of the thin layer 6 thickness remaining after Stage A on substrates 1 which have or have not been subjected to a second sacrificial oxidation 300 accompanied by an annealing 330 in accordance with the process according to the invention. More specifically, as each point corresponds to a density of defects determined under a microscope for a thin layer 6 thickness remaining after Stage A, it should be understood that the thinner the thickness of this remaining thin layer 6, the more defects are displayed. Thus, for a concentration by volume of defects which will be constant over the entire thickness of the thin layer 6, the corresponding curve ought to be decreasing toward the high values for thin layer 6 thicknesses remaining after Stage A.

The upper curve corresponds to measurements carried out on a substrate 1 with 3650 Å of transferred thin layer 6 which has been subjected to a sacrificial oxidation with annealing (removing 650 Å of thin layer 6), followed by a polishing (removing 950 Å of thin layer 6) in order to result in a thin layer 6 of 2050 Å, before treatment by the Secco technique set out above. A strong rise toward the low values for thin layer 6 thicknesses remaining after Stage A is observed in this curve. It is representative of the surface defects induced by the polishing 200.

The lower curve corresponds to measurements carried out on a substrate 1 with 4300 Å of transferred thin layer 6 which has been subjected, before treatment by the Secco treatment set out above, to the process according to the invention comprising a first sacrificial oxidation 100 with annealing (removing 650 Å of thin layer 6), followed by a polishing 200 (removing 950 Å of thin layer 6) and by a second sacrificial oxidation with annealing 300 (removing 650 Å of thin layer 6) in order also to result in a thin layer 6 of 2050 Å. It is found that the strong rise toward the low values for thin layer 6 thicknesses remaining after Stage A which appears in the upper curve has disappeared. There are therefore virtually no more defects 15 induced by the polishing 200 in the working layer 6 after the substrate 1 has been subjected to the process according to the invention. It is also noticed that the base level of the lower curve lies approximately one order of magnitude below the base level of the upper curve. This can be attributed to the fact that better removal of the residual defects originating from the implantation and from the cleaving has been achieved by virtue of the process in accordance with the present invention.

The surface density of Secco defects measured on the substrate 1 which has been subjected to the process according to the invention is less than $5 \times 10^2$ cm$^{-2}$ over the entire range of remaining thin layer 6 thickness.

Thus, in the case of the preparation of an SOI substrate 1 by the SmartCut® process, a layer of silicon comprising defects generated by the polishing 200 comprising a concentration of defects corresponding to surface densities of Secco defects of greater than $5 \times 10^2$ cm$^{-2}$ will advantageously be removed, by virtue of the second sacrificial oxidation 300, when the thin layer 6 results from a substrate with, for example, a thin layer of silicon with a low defect density.

Analogous results would be obtained with, for example, a thin layer of epitaxied silicon, of silicon annealed under hydrogen or of so-called "low COPs" silicon, that is to say with a low density of "COPs" defects (from the acronym of the expression "Crystal Originated Particles"), or of FZ or CZ silicon with a low level of "COPs" defects.

Surprisingly, it has additionally be found that the second embodiment of the process according to the invention described above makes it possible to eliminate the so-called "edge falls" phenomenon of the embedded oxide forming the insulator 4 and of the thin layer 6. This edge falls phenomenon arises with SOI substrates 1 prepared with the processes of SmartCut® type of the prior art not comprising a second sacrificial oxidation 300 by the detachment of debris and particles originating from the embedded oxide and from the thin layer 6. This is because, as illustrated diagrammatically in FIG. 10A, the layer of embedded oxide forming the insulator 4 and the thin layer 6 exhibit, after the first sacrificial oxidation 100, a beveled appearance close to the edge of the substrate 1. The tip of each of these layers 4, 6 and more particularly that of the transferred thin layer 6 is capable of separating from the substrate 1 during the various technological stages in the manufacture of electronic or optoelectronic components on these substrates 1.

However, as illustrated in FIG. 10B, after the second sacrificial oxidation 300, oxide is formed, in particular on the tip of the thin layer 6, as a continuation of the layer of embedded oxide forming the insulator 4. This basically makes it possible to avoid the presence of a tip at the edge of the thin layer 6 which is brittle and easily detachable from the embedded oxide forming the underlying insulator 4.

The first and second embodiments of the process according to the invention which are described above relate to applications targeted at improving the quality of thin layers 6 of silicon on insulator which are obtained by the "Smart-Cut®" process. A description has more particularly been given of the second embodiment of the process according to the invention in the context of its application to an SOI structure composed of a thin layer 6 of approximately 2000 Å of silicon on an insulating layer 4 of 4000 Å of silicon oxide. In order to obtain a thin layer 6 of this thickness, it is necessary to implant hydrogen atoms with an energy of between 70 and 100 keV. In order to obtain thicker layers 6, it will be necessary to implant these atoms more deeply, that is to say with a higher energy. However, the more deeply the atoms are implanted, the more spread out will be the distribution of the concentration of these atoms in the layer 6 and the more spread out also will be the concentration of defects relating to the implantation. The thickness of defect-comprising material to be removed by the process according to the present invention will then be greater. The thicknesses mentioned above are therefore in no way limiting.

It will also be understood that the process according to the invention can be employed in the context of other applications. Generally, the process according to the invention is of use each time that it is desired to remove a surface layer while retaining the quality of the underlying material. As mentioned above in the embodiment of the process comprising an annealing stage 130, 330, the annealing can have a repairing effect which can even make it possible to improve the quality of this underlying material.

The process according to the invention has been described above by taking the case of silicon as illustrative example but it must be understood that which has been set out above is entirely applicable to materials other than silicon, in particular other semi-conducting materials.

An example of an embodiment of the process according to the invention has been described above in which each sacrificial oxidation comprises a stage of annealing the substrate. However, it must be understood that it would not be departing from the scope of the invention if only one of the sacrificial oxidations comprises an annealing stage. Thus, according to alternative implementational examples of the process according to the invention, only the first or the second sacrificial oxidation comprises an annealing stage analogous to that described above.

While illustrative embodiments of the invention are disclosed herein, it will be appreciated that numerous modifications and other embodiments may be devised by those skilled in the art. Therefore, it will be understood that the appended claims are intended to cover all such modifications and embodiments that come within the spirit and scope of the present invention.

What is claimed is:

1. A multilayer wafer, comprising:
   a base substrate;
   a first layer associated with the base substrate; and
   a second layer having a thickness and a lateral edge and being associated with the first layer on a side opposite from the base substrate, and comprising silicon having a SECCO defect density that is less than 500 cm$^{-2}$ and substantially constant throughout the entire thickness of the second layer.

2. The wafer of claim 1, in the form of a semiconductor wafer wherein the second layer comprises an oxidizable semiconductor material and the first layer comprises an oxidized insulator material.

3. The wafer of claim 2, wherein the first layer comprises silicon dioxide and the second comprises silicon.

4. The wafer of claim 3, wherein the first layer has a thickness of about 4000 Å and the second layer has a thickness of about 2000 Å.

5. The wafer of claim 1, wherein the first layer comprises silicon dioxide and the second comprises silicon.

6. The wafer of claim 1, wherein the first layer has a thickness of about 4000 Å and the second layer has a thickness of about 2000 Å.

7. The wafer of claim 1, wherein the first layer includes a ridge that protrudes away from the base substrate and is disposed adjacent the lateral edge of the second layer for preventing edge falls in the lateral edge.

8. A multilayer wafer, comprising:
a base substrate;
a first layer associated with the base substrate and having a ridge that protrudes away from the base substrate; and
a second surface layer having a thickness and a lateral edge and being associated with the first layer on a side opposite from the base substrate;
wherein the ridge of the first layer surround an acute portion of the lateral edge of the second layer and is configured and dimensioned to extend beyond and protrude above the thickness of the second surface layer to prevent edge falls in the lateral edge of the second layer.

9. The wafer of claim 8, in the form of a semiconductor wafer wherein the second layer comprises an oxidizable semiconductor material and the first layer comprises an oxidized insulator material.

10. The wafer of claim 9, wherein the first layer comprises silicon dioxide and the second comprises silicon.

11. The wafer of claim 10, wherein the first layer has a thickness of about 4000 Å and the second layer has a thickness of about 2000 Å.

12. The wafer of claim 8, wherein the first layer comprises silicon dioxide and the second comprises silicon.

13. The wafer of claim 12, wherein the ridge is formed by an embedded layer of silicon dioxide.

14. A multilayer wafer, comprising:
a base substrate;
a first layer associated with the base substrate and having a ridge that protrudes away from the base substrate; and
a second layer having a thickness and a lateral edge and being associated with the first layer on a side opposite from the base substrate;
wherein the second layer has a SECCO defect density that is less than 500 $cm^{-2}$ and substantially constant throughout the entire thickness of the second layer, and
wherein the ridge of the first layer is disposed adjacent the lateral edge of the second layer and is configured and dimensioned to prevent edge falls in the lateral edge.

15. The wafer of claim 14, wherein the first layer has a thickness of about 4000 Å and the second layer has a thickness of about 2000 Å.

* * * * *